United States Patent
Chen et al.

(10) Patent No.: US 6,394,104 B1
(45) Date of Patent: May 28, 2002

(54) METHOD OF CONTROLLING AND IMPROVING SOG ETCHBACK ETCHER

(75) Inventors: Sen-Fu Chen, Taipei; Ming-Chieh Yeh, Hsin-chu County, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/144,822

(22) Filed: Aug. 28, 1998

(51) Int. Cl.$^7$ .................................................. B08B 9/00
(52) U.S. Cl. ........................ 134/1.1; 134/21; 134/22.1; 216/67; 438/905
(58) Field of Search ...................... 216/37, 67; 134/1.1, 134/8, 22.1, 21; 438/905

(56) References Cited

U.S. PATENT DOCUMENTS

| | | | | |
|---|---|---|---|---|
| 5,294,294 A | * | 3/1994 | Namose | 156/643 |
| 5,514,246 A | * | 5/1996 | Blalock | 156/643.1 |
| 5,585,012 A | * | 12/1996 | Wu et al. | 216/71 |
| 5,639,345 A | | 6/1997 | Huang et al. | 156/657.1 |
| 5,647,953 A | * | 7/1997 | Williams et al. | 156/643.1 |
| 5,679,211 A | | 10/1997 | Huang | 156/643.1 |
| 6,004,631 A | * | 12/1999 | Mori | 427/534 |

* cited by examiner

Primary Examiner—Randy Gulakowski
Assistant Examiner—Allan Olsen
(74) Attorney, Agent, or Firm—George O. Saile; Stephen B. Ackerman; Rosemary L. S. Pike

(57) ABSTRACT

A new method for improving particle level, stability of etch rate, and better etch uniformity by using a dry plasma clean to remove polymer buildup from the upper electrode and walls of an etch chamber after spin-on-glass etchback is described. An etching chamber having a lower electrode, upper electrode, and interior walls is provided. Spin-on-glass etchback is performed within the etching chamber whereby a polymer buildup forms on surfaces of chamber. A dummy wafer is placed into the etching chamber and the polymer buildup within the chamber is removed using a dry plasma cleaning process.

12 Claims, 2 Drawing Sheets

METHOD OF CONTROLLING AND IMPROVING SOG ETCHBACK ETCHER

BACKGROUND OF THE INVENTION (1) Field of the Invention

The invention relates to a method of removing polymer buildup on a wafer and on the etch chamber walls in the manufacture of integrated circuits, and more particularly, to a method of removing polymer buildup after spin-on-glass etchback in the manufacture of integrated circuits.

(2) Description of the Prior Art

In the current sub-micron technology of the manufacture of integrated circuit devices, the spin-on-glass etchback process has been adopted widely to improve planarization. However, spin-on-glass etchback causes the buildup of polymer on the upper electrode and the chamber wall of the etch chamber. The polymer buildup on the electrode results in an unstable etch rate and non-uniformity.

U.S. Pat. No. 5,679,211 to Huang discloses an oxygen-containing plasma treatment to remove a polymer formed on a spin-on-glass layer by the process of etching the spin-on-glass layer. U.S. Pat. No. 5,639,345 to Huang et al teaches a two-step SOG etchback process. These processes address polymer buildup on the wafer rather than the problem of polymer buildup in the etch chamber.

SUMMARY OF THE INVENTION

Accordingly, a principal object of the present invention is to provide an effective and very manufacturable method of removing polymer buildup from an etch chamber.

A further object of the invention is to provide a method for removing polymer buildup from the upper electrode and walls of an etch chamber after spin-on-glass etchback.

A still further object of the invention is to provide a method for removing polymer buildup from the upper electrode and walls of an etch chamber after spin-on-glass etchback to improve the etch rate and etch uniformity.

Yet another object is to provide a method for improving particle level, stability of etch rate, and etch uniformity by removing polymer buildup from the upper electrode and walls of an etch chamber after spin-on-glass etchback.

Yet another object of the invention is to provide a method for improving particle level, stability of etch rate, and etch uniformity by using a dry plasma clean to remove polymer buildup from the upper electrode and walls of an etch chamber after spin-on-glass etchback.

In accordance with the objects of this invention a new method for improving particle level, stability of etch rate, and etch uniformity by using a dry plasma clean to remove polymer buildup from the upper electrode and walls of an etch chamber after spin-on-glass etchback is achieved. An etching chamber having a lower electrode, upper electrode, and interior walls is provided. Spin-on-glass etchback is performed within the etching chamber whereby a polymer buildup forms on surfaces of the chamber. A dummy wafer is placed into the etching chamber and the polymer buildup within the chamber is removed using a dry plasma cleaning process.

BRIEF DESCRIPTION OF THE DRAWINGS

In the accompanying drawings forming a material part of this description, there is shown.

DESCRIPTION OF THE PREFERRED EMBODIMENTS

Figure 1:
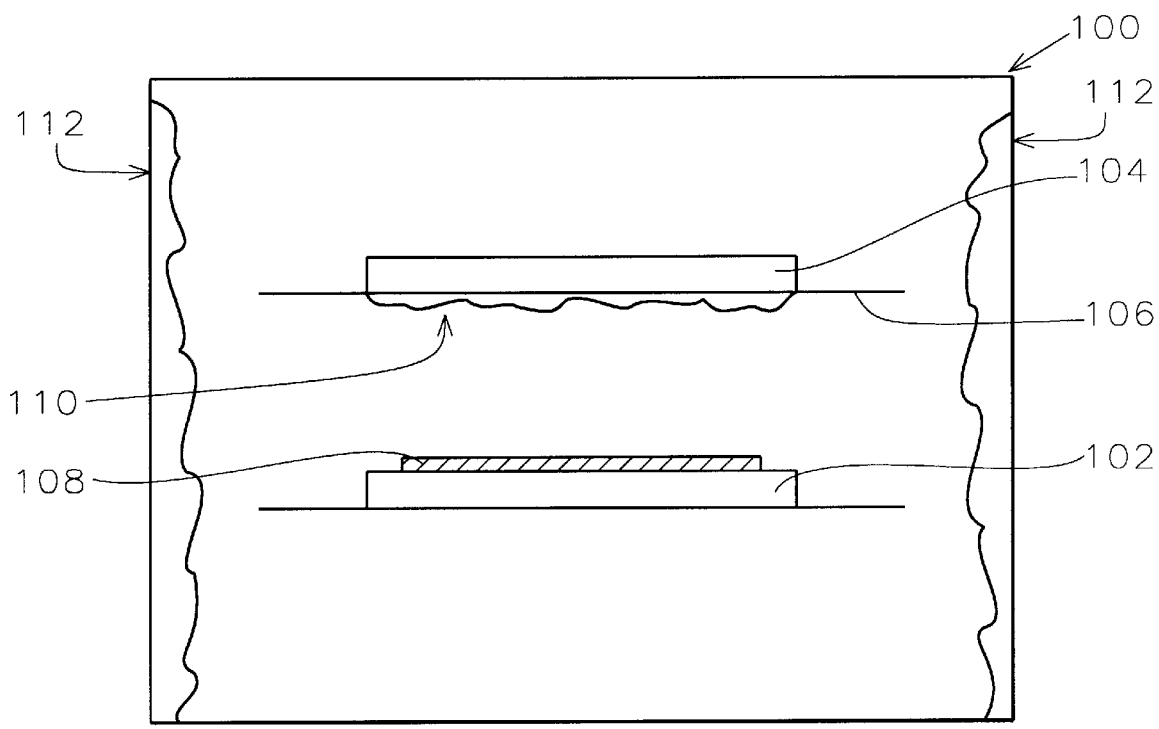
FIG. 1 schematically illustrates in cross-sectional representation a spin-on-glass etchback chamber.

Referring now more particularly to FIG. 1, there is illustrated an extremely simplified representation of an etch chamber 100 such as that used to etch back a spin-on-glass layer. The lower electrode 102 and upper electrode, or cathode, 104 are illustrated as well as clamps 106. The wafer 108 is placed onto the lower electrode 102.

Figure 2:
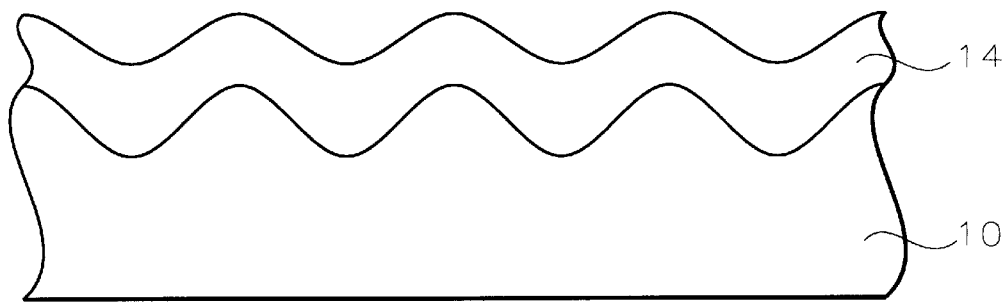
FIGS. 2 and 3 illustrate in cross-sectional representation a production wafer of the present invention.

FIG. 2 illustrates a portion of a partially completed integrated circuit device. There is shown a semiconductor substrate 10, preferably composed of monocrystalline silicon. Semiconductor device structures and insulating layers, not shown, may be formed in and on the semiconductor substrate. A layer of spin-on-glass 14 is coated on the surface of the substrate to a typical thickness of between about 5000 and 20,000 Angstroms.

The spin-on-glass layer is baked and cured as is conventional in the art. For example, the spin-on-glass layer is baked at a temperature of between about 20 and 300 ° C. for 1 to 5 minutes and then cured at a temperature of between about 300 and 450° C. for 30 to 100 minutes.

The spin-on-glass layer is now to be planarized by etchback. The wafer 108 is placed on the lower electrode 102, as illustrated in FIG. 1. Typically, the spin-on-glass layer is etched back using $CF_4/CHF_3$ chemistry. For example, $CF_4$ is flowed at 80 to 150 sccm, $CHF_3$ is flowed at 40 to 100 sccm, and Ar is flowed at 100 to 300 sccm under pressure of 300 to 600 mTorr and power of 700 to 1000 watts for a duration of 80 to 200 seconds.

Figure 3:
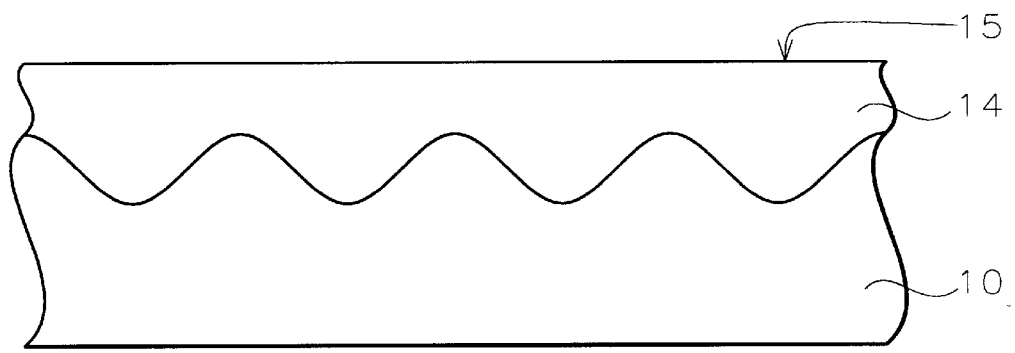

FIG. 3 illustrates the planarized surface 15 of the spin-on-glass layer 14 after etchback.

As wafers are processed through the etch chamber 100, polymer builds up on the surface of the cathode, as illustrated by 110, and on the walls of the chamber, as illustrated by 112. The $CHF_3$ used in the spin-on-glass etchback recipe is a major source of the polymer problem. Etch chamber conditions become progressively worse; that is, unstable etch rate, bad etch rate uniformity, and higher particle levels. Non-uniformity of wafers and more down time of the etching equipment has been observed as well.

Figure 4:
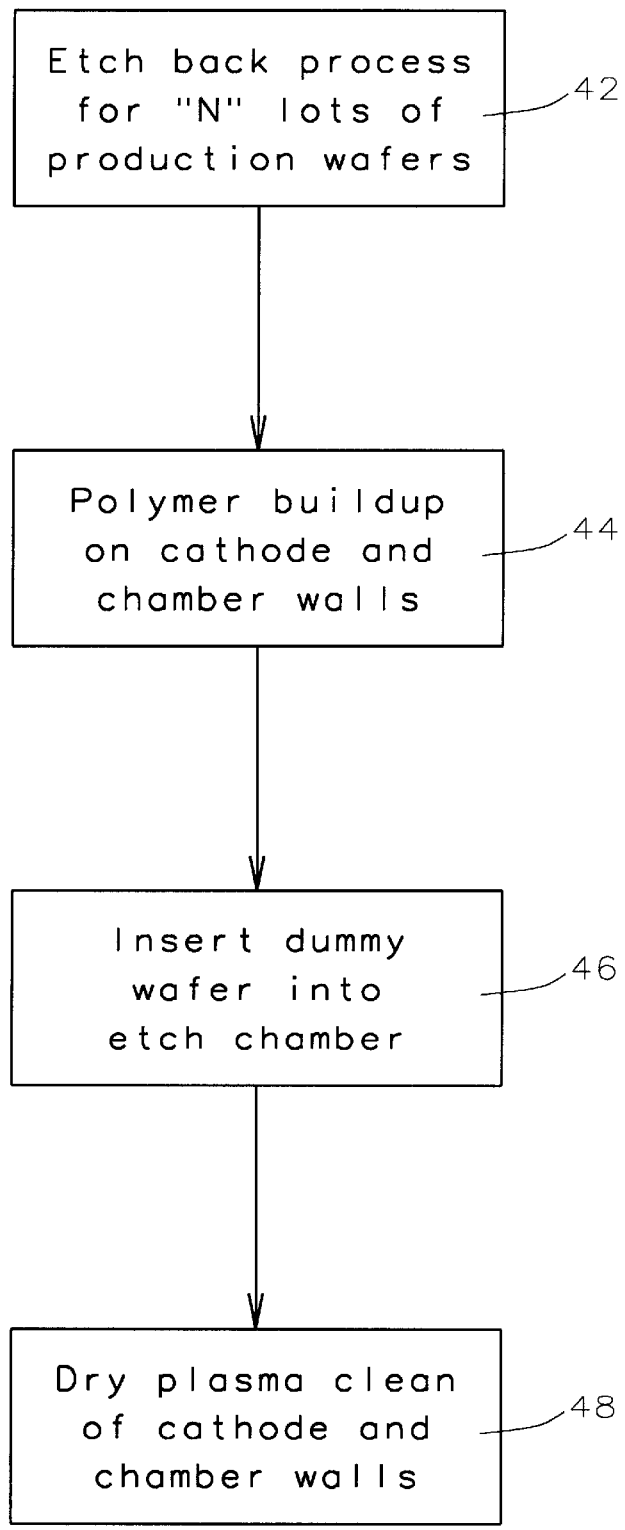
FIG. 4 is a flowchart depicting the chamber cleaning process of the present invention.

The process of the present invention provides a method for periodically cleaning the polymer from the etch chamber. FIG. 4 is a flowchart illustrating the process of the invention. According to the first step illustrated, 42, the etchback process is performed for "N" lots of production wafers. The number "N" can be determined experimentally in order to balance performance and cost control considerations. The preferred range of "N" is from 8 to 12 lots. In determining an optimum "N," oxide and spin-on-glass etchrate and uniformity issues should be considered.

Polymer builds up on the cathode and the chamber walls, 44, during the course of performing the etchback process for "N" lots.

Now, after "N" lots of wafers have been etched back, the dry plasma clean process of the present invention is performed. According to step 46, a dummy wafer is placed into the etch chamber. The dummy wafer is preferably a bare-silicon wafer.

Next, the dry plasma cleaning step 48 is performed. Argon, $O_2$, and $CF_4$ are passed into the etching chamber and plasma is turned on. Specifically, Ar is flowed at 300 to 500 sccm, $O_2$ is flowed at 15 to 100 sccm, and $CF_4$ is flowed at 40 to 100 sccm under a pressure of 200 to 600 mTorr and power of 500 to 1000 watts for a duration of 20 to 50 minutes.

The plasma cleaning process of the present invention removes the polymer buildup from the cathode surface and from the chamber walls of the etch chamber. The etching chamber condition is recovered after the cleaning step. The plasma dry clean process improves the particle level, etch rate stability, and etch uniformity of the etch chamber along with increasing the available for use time of the etching equipment.

The dummy wafer is removed from the etcher and production lots can again be run through the etcher. After another "N" lots of production wafers have been run, the cleaning process of the present invention is performed again.

The process of the present invention provides a simple and effective method of removing polymer buildup from the walls and from the upper electrode of an etching chamber. The dry plasma clean process of the invention uses Ar, $O_2$, and $CF_4$ gases in plasma to remove the polymer buildup and hence improve the performance of the sin-on-glass etchback process.

While the invention has been particularly shown and described with reference to the preferred embodiments thereof, it will be understood by those skilled in the art that various changes in form and details may be made without departing from the spirit and scope of the invention.

What is claimed is:

1. A method of removing polymer buildup from the surfaces of an etching chamber comprising:

providing said etching chamber in which spin-on-glass etchback is performed whereby said polymer buildup is formed on said surfaces of said chamber including an upper electrode in said chamber;

placing a dummy wafer into said etching chamber; and removing said polymer buildup from said surfaces of said chamber including said upper electrode using a dry plasma cleaning process comprising flowing Ar at 300 to 500 sccm, flowing $O_2$ at 15 to 100 sccm, and flowing $CF_4$ at 40 to 100 sccm under a pressure of 200 to 600 mTorr and power of 500 to 1000 watts for a duration of 20 to 50 minutes.

2. A method according to claim 1 wherein said polymer buildup is formed during said spin-on-glass etchback.

3. A method according to claim 1 wherein said step of removing said polymer is performed after "N" lots of production wafers have undergone said spin-on-glass etchback process wherein "N" is greater than 1.

4. A method according to claim 1 wherein said step of removing said polymer is performed after "N" lots of production wafers have undergone said spin-on-glass etchback process wherein "N" is between about 8 and 12.

5. The method according to claim 1 wherein said dummy wafer comprises bare silicon.

6. A method of removing polymer buildup from the surfaces of an etching chamber comprising:

providing said etching chamber having an upper electrode and a lower electrode and interior walls wherein during spin-on-glass etchback said polymer buildup is formed on said upper electrode and said interior walls of said chamber;

placing a dummy wafer into said etching chamber; and removing said polymer buildup from said surfaces of said chamber including said upper electrode and said interior walls using a dry plasma cleaning process comprising flowing Ar at 300 to 500 sccm, flowing $O_2$ at 15 to 100 sccm, and flowing $CF_4$ at 40 to 100 sccm under a pressure of 200 to 600 mTorr and power of 500 to 1000 watts for a duration of 20 to 50 minutes.

7. A method according to claim 6 wherein said step of removing said polymer is performed after "N" lots of production wafers have undergone said spin-on-glass etchback process wherein "N" is greater than 1.

8. A method according to claim 6 wherein said step of removing said polymer is performed after "N" lots of production wafers have undergone said spin-on-glass etchback process wherein "N" is between about 8 and 12.

9. The method according to claim 6 wherein said dummy wafer comprises bare silicon.

10. A method of removing polymer buildup from the surfaces of an etching chamber comprising:

providing said etching chamber having an upper electrode and a lower electrode and interior walls;

placing a production wafer having a spin-on-glass layer formed thereon on said lower electrode;

etching back said spin-on-glass layer whereby said polymer buildup is formed on said upper electrode and said interior walls of said etching chamber;

removing said production wafer;

repeating said steps of placing said production wafer on said lower electrode, etching back said spin-on-glass layer, and removing said production wafer for "N" lots of production wafers where "N" is greater than 1;

thereafter, placing a dummy wafer into said etching chamber; and removing said polymer buildup from said surfaces of said chamber including said upper electrode and said interior walls using a dry plasma cleaning process comprising flowing Ar at 300 to 500 sccm, flowing $O_2$ at 15 to 100 sccm, and flowing $CF_4$ at 40 to 100 sccm under a pressure of 200 to 600 mTorr and power of 500 to 1000 watts for a duration of 20 to 50 minutes.

11. A method according to claim 10 wherein said "N" is between about 8 and 12.

12. The method according to claim 10 wherein said dummy wafer comprises bare silicon.

* * * * *